United States Patent [19]

Wang et al.

[11] Patent Number: 5,708,361
[45] Date of Patent: Jan. 13, 1998

[54] ANTENNA ARRANGEMENT FOR A MAGNETIC RESONANCE APPARATUS

[75] Inventors: Jianmin Wang, Erlangen; Axel Friedrich, Nurenberg, both of Germany

[73] Assignee: Siemens Aktiengesellschaft, Munich, Germany

[21] Appl. No.: 721,119

[22] Filed: Sep. 26, 1996

[30]   Foreign Application Priority Data

Sep. 29, 1995 [DE] Germany .................. 195 36 531.3

[51] Int. Cl.$^6$ ........................................ G01V 3/00
[52] U.S. Cl. .............................. 324/318; 324/322
[58] Field of Search ........................ 324/318, 322, 324/319, 320, 300, 314; 128/653.5

[56]   References Cited

U.S. PATENT DOCUMENTS

| | | | |
|---|---|---|---|
| 4,812,764 | 3/1989 | Bendall | 324/318 |
| 5,256,971 | 10/1993 | Boskamp | 324/318 |
| 5,302,901 | 4/1994 | Snelten | 324/318 |
| 5,376,885 | 12/1994 | Arakawa et al. | 324/318 |

*Primary Examiner*—Louis M. Arana
*Attorney, Agent, or Firm*—Hill, Steadman & Simpson

[57]   ABSTRACT

An antenna arrangement for a magnetic resonance apparatus has at least two adjacent individual antennas. Each individual antenna has at least one conductor loop. For mutual decoupling, the conductor loops of the adjacent individual antennas each have an interruption. The interruptions are electrically connected in parallel and are jumpered with at least one capacitive element, the capacitive element having a capacitance value at which the individual antennas are decoupled from one another.

5 Claims, 1 Drawing Sheet

000
ANTENNA ARRANGEMENT FOR A MAGNETIC RESONANCE APPARATUS

BACKGROUND OF THE INVENTION

1. Field of the Invention

The present invention is directed to an antenna arrangement for a magnetic resonance apparatus of the type having at least two adjacent individual antennas, each individual antenna having at least one conductor loop.

2. Description of the Prior Art

In an antenna arrangement with several individual antennas, an RF current in one individual antenna can induce a voltage in an adjacent individual antenna, which is known as coupling. Coupling can be present in circularly polarizing antenna arrangements, in which two antenna systems are oriented perpendicularly to one another, as well as in antenna arrays in which the individual antennas have in generally the same orientation. Couplings worsen the signal-noise distance (S/N ratio). In addition, the expense for the testing of coupled individual antennas is higher than for the testing of non-coupled individual antennas. The goal is thus to avoid a coupling of individual antennas.

In U.S. Pat. No. 5,216,368, therefore, an antenna arrangement of the above type is described having two antenna systems oriented perpendicularly to one another, wherein, given a precise orientation, the two antenna systems are decoupled from one another by means of their arrangement alone. Asymmetries, however, cause couplings of the two antenna systems, which are compensated by a capacitor that connects the two antenna systems.

In German OS 38 20 168, an antenna arrangement is described in which a coupling of adjacent individual antennas by means of a mutual overlapping is avoided.

A further measure for reducing couplings is disclosed in PCT application WO89/05115. In this arrangement, the impedance of a preamplifier connected to the individual antennas is selected so that an impedance that is effective for the individual antennas at their terminals (this impedance also bring determined by the input resistance of the preamplifier) is as large as possible. The current induced in the individual antennas thereby almost disappears, so the voltage induced in the other individual antennas becomes correspondingly low and negligible. A sufficient decoupling can be achieved with this arrangement only at a high expense. This type of decoupling is thus used in practice with other decoupling techniques.

SUMMARY OF THE INVENTION

An object of the present invention is to provide another possibility for decoupling of adjacent individual antennas in an antenna system having multiple individual antennas.

This object is an antenna system constructed according to the invention wherein the conductor loops of the adjacent individual antennas each have an interruption (gap), and wherein the individual antennas are electrically connected to the interruptions in parallel, and wherein the interruptions are jumpered with at least one capacitive element, and wherein the capacitive element having a capacitance value at which the individual antennas are decoupled from one another. The current induced in an individual antenna thereby induces a capacitive voltage in the adjacent individual antenna via the common capacitance formed in this way for both individual antennas, and this capacitive voltage compensates a voltage induced by the magnetic coupling.

Couplings due to the electrical connection lines between the individual antennas are reduced if, according to one embodiment of the invention, the interruptions of adjacent individual antennas are disposed in parts of the conductor loops that face one another. This permits the connection leads to be kept short.

In more complicated antenna structures, a coupling due to connection leads is avoided according to another embodiment wherein in the interruptions or the capacitive elements are connected with one another via a sheath wave barrier (jacket).

In another embodiment a preamplifier is connected with each individual antenna via a transformation and matching circuit, the preamplifier having an input resistance so that an impedance effective for the individual antenna, which impedance is determined by the transformation and matching circuit and by the input resistance, is as large as possible. This two-stage decoupling reduces the current in the individual antennas that causes couplings, plus a residual coupling is compensated by the capacitive elements common for both individual antennas.

DESCRIPTION OF THE PREFERRED EMBODIMENTS

Figure 1:
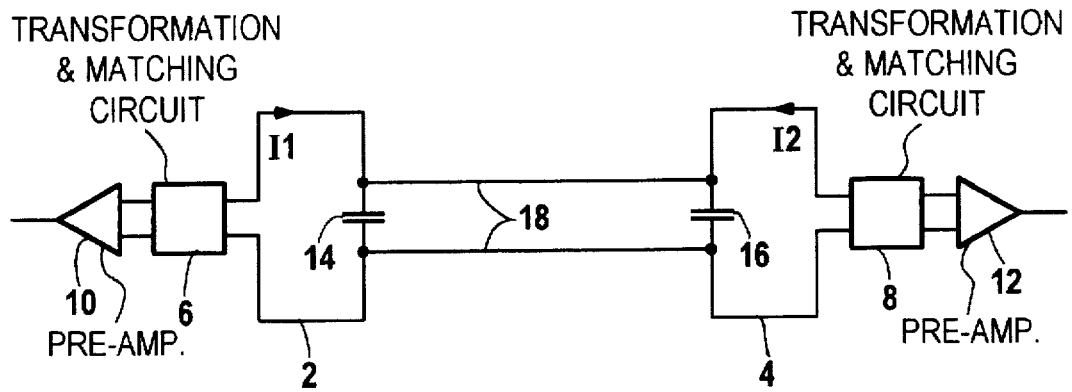
FIG. 1 is a schematic diagram of an antenna system constructed in accordance with the principles of the present invention which achieves a decoupling of two individual antennas.

FIG. 1 shows, as an antenna arrangement, an antenna array having two adjacent individual antennas 2 and 4 which, for example, are arranged in one plane and whose respective sensitivity (axes) directions are oriented parallel to one another. Each individual antenna 2 and 4 is formed by a single conductor loop, which here is fashioned in the shape of a rectangle. The individual antennas 2 and 4 are respectively connected to preamplifiers 10 and 12 via respective transformation and matching networks 6 and 8. The preamplifiers 10 and 12 each have an input resistance chosen so that an impedance that is effective for the individual antenna 2 or 4 connected thereto is as large as possible. This impedance is determined by the transformation and matching circuit 6 or 8 and by the input resistance. This can be achieved, for example, by selecting the input resistance of each preamplifier 10 and 12 so as to deviate significantly from the optimal noise source impedance, which is the impedance necessary to obtain an optimal signal-to-noise ratio.

For decoupling of the two individual antennas 2 and 4 from one another, the conductor loop of each individual antenna 2 and 4 is interrupted at parts of the conductor loops that are facing one another. The interruptions are respectively jumpered with capacitive elements 14 and 16. The capacitive elements 14 and 16 are electrically connected in parallel directly via a connection line 18.

In the following, the decoupling effect of the capacitive elements 14, 16 is described. A current $I_1$ flowing in the individual antenna 2 induces a voltage in the adjacent individual antenna 4 via a mutual inductance M between the two individual antennas 2 and 4, and additionally produces a capacitive voltage drop across the respective capacitive elements 14 and 16, connected in parallel. Also, a current $I_2$ flowing in the individual antenna 4 induces a voltage in the adjacent individual antenna 2 via the mutual inductance M, and additionally produces a capacitive voltage drop across the respective capacitive elements 14 and 16. If the capacitance of the capacitive element 14 in the individual antenna 2 is designated $C_1$ and the capacitance of the capacitive element 16 in the individual antenna 4 is designated $C_2$, the following holds for the overall voltage $U_1$ in the individual antenna 2:

$$U_1 = j\omega M I_2 + \frac{1}{j\omega(C_1 + C_2)} I_2$$

and, for the overall voltage $U_2$ in the individual antenna 4:

$$U_2 = j\omega M I_1 + \frac{1}{j\omega(C_1 + C_2)} I_1$$

whereby j signifies $\sqrt{-1}$ The coupling between the two individual antennas is then compensated if the induced voltage in the individual antennas 2 and 4 is equal to the capacitive voltage drop. The following then holds:

$$\omega M = \frac{1}{\omega(C_1 + C_2)}$$

The latter expression shows that it is always possible to choose the capacitances $C_1$ and $C_2$ of the capacitive elements 14 and 16 so that the two individual antennas 2 and 4 are decoupled. In particular, it is possible to use only one capacitive element 14 or 16, and to omit the other capacitive element 16 or 14, since the sum of the capacitances $C_1 + C_2$ is always effective. It must only be insured that the terminals, i.e. the electrical parallel circuit, are polarized so that the mutual inductance M remains positive.

Figure 2:
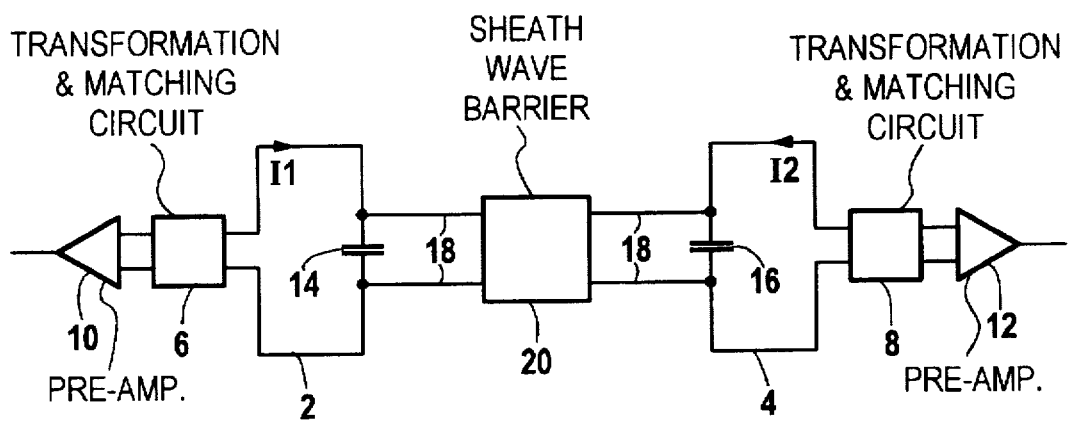
FIG. 2 is a schematic diagram of a further improved decoupling arrangement in accordance with the invention.

FIG. 2 shows an antenna arrangement with decoupled individual antennas 2 and 4, in which a coupling of the individual antennas 2 and 4 by the connection lines 18 is suppressed by an inserted wave trap sheath 20. Couplings via the connection line 18 can arise in more complicated antenna arrangements and individual antenna structures. In other respects the antenna arrangement according to FIG. 2 corresponds to the antenna arrangement according to FIG. 1.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna arrangement for a magnetic resonance imaging apparatus comprising:

at least two adjacent individual antennas, each individual antenna having at least one conductor loop, each conductor loop having an interruption therein;

an electrical connection directly connecting the respective interruptions in the respective conductor loops of said at least two individual antennas in parallel; and at least one capacitive element connected across at least one of said interruptions, said capacitive element having a capacitance for decoupling said at least two individual antennas from each other.

2. An antenna arrangement as claimed in claim 1 wherein the respective conductor loops of the two adjacent individual antennas have respective sections facing each other, and wherein said interruptions are respectively disposed in said sections.

3. An antenna arrangement as claimed in claim 1 comprising a capacitive element disposed in every interruption.

4. An antenna arrangement as claimed in claim 1 wherein said electrical connection includes a sheath wave barrier.

5. An antenna arrangement as claimed in claim 1 further comprising, for each individual antenna;

a preamplifier connected to the individual antenna and a transformation and matching circuit connected between the preamplifier and the individual antenna, said preamplifier having an input resistance for maximizing an impedance effective for the individual antenna connected thereto, said impedance being determined by said transformation and matching circuit and by said input resistance.

* * * * *